United States Patent [19]

Nguyen et al.

[11] Patent Number: 4,983,968
[45] Date of Patent: Jan. 8, 1991

[54] PARALLEL ANALOG-DIGITAL CONVERTER WITH ERROR-CORRECTION CIRCUIT

[75] Inventors: Truong-Thao Nguyen, Bures sur Yvette; Francois R. Thomas, Vanves, both of France

[73] Assignee: Thomson Composants Microondes, Puteaux, France

[21] Appl. No.: 418,538

[22] Filed: Oct. 10, 1989

[30] Foreign Application Priority Data

Oct. 14, 1988 [FR] France .................................. 88 13539

[51] Int. Cl.$^5$ .......................... H03M 1/06; H03M 1/36
[52] U.S. Cl. ...................................... 341/118; 341/159
[58] Field of Search ..................... 341/159, 118, 96, 97, 341/158

[56] References Cited

U.S. PATENT DOCUMENTS

| | | | |
|---|---|---|---|
| 3,537,101 | 1/1967 | Campanella et al. | 341/159 |
| 3,611,350 | 10/1971 | Leibowitz | 341/159 |
| 4,586,025 | 4/1986 | Knierim | 341/159 |
| 4,596,978 | 6/1986 | Fujita | 341/159 |
| 4,644,322 | 2/1987 | Fujita | 341/96 X |
| 4,712,087 | 12/1987 | Traa | 341/159 |
| 4,884,075 | 11/1989 | Mangelsdorf | 341/159 |
| 4,897,657 | 1/1990 | Brubaker | 341/159 |

Primary Examiner—William M. Shoop, Jr.
Assistant Examiner—Sharon D. Logan
Attorney, Agent, or Firm—Oblon, Spivak, McClelland, Maier & Neustadt

[57] ABSTRACT

The disclosure pertains to parallel analog-digital converters, the first comparator stage of which give a so-called thermometer scale, formed by a sequence of logic "ones" and logic "zeros". According to the disclosure, a corrector stage is added on in series with the comparator stage. If a comparator of the first stage accidentally gives a logic value opposite that given by the two neighboring comparators, the corrector stages forces the accidentally erroneous value to assume the same value as that the values given by the two neighboring comparators, if and only if these values are equal. The disclosed device can be applied to signal processing ADCs.

3 Claims, 2 Drawing Sheets

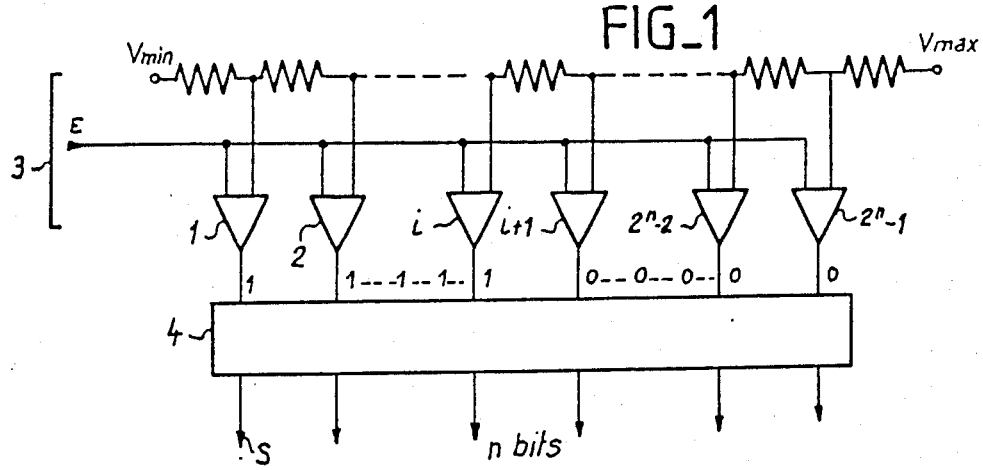
FIG_1
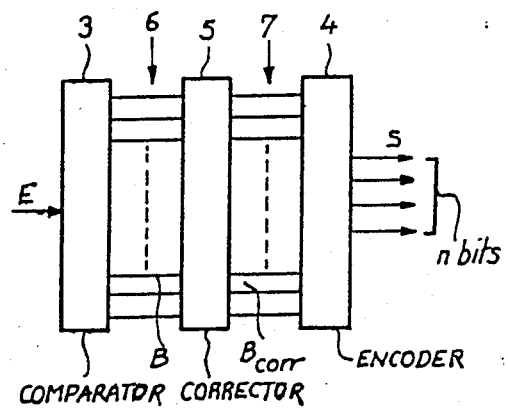
FIG_2
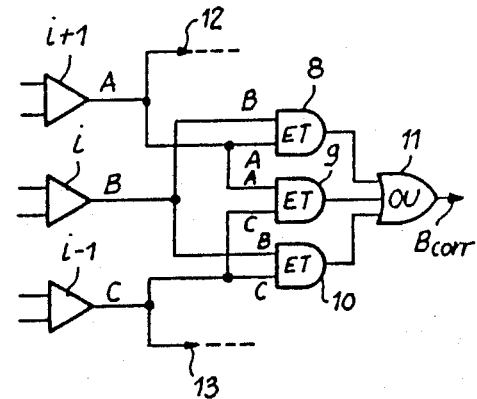
FIG_3
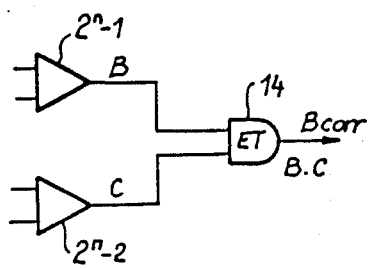
FIG_5
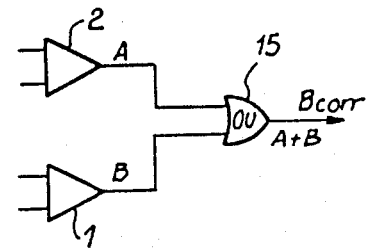
FIG_6

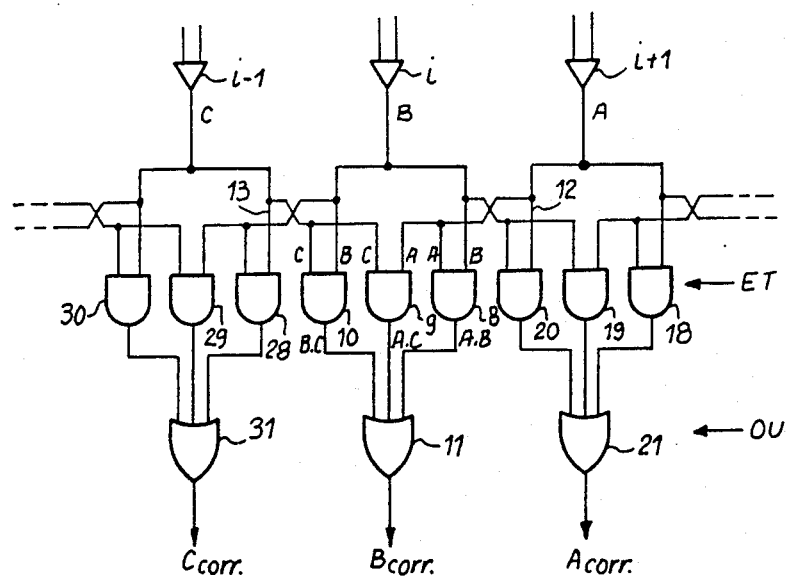
FIG_4
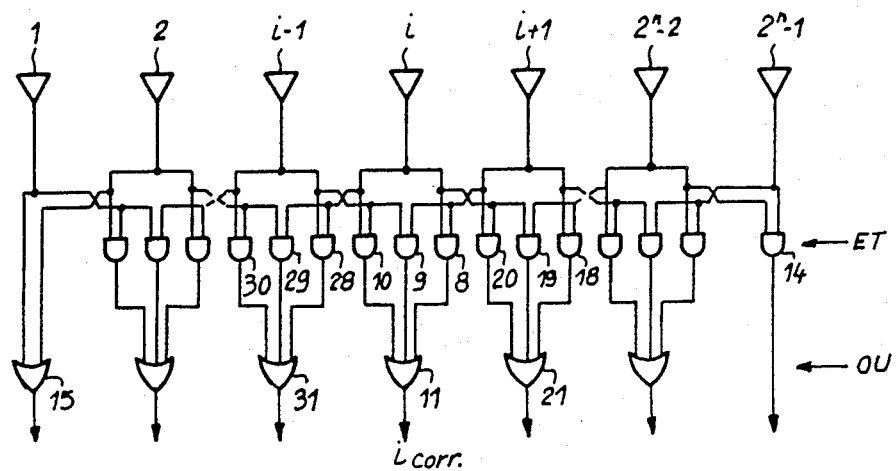
FIG_7

PARALLEL ANALOG-DIGITAL CONVERTER WITH ERROR-CORRECTION CIRCUIT

BACKGROUND OF THE INVENTION

1. Field of the Invention

The present invention concerns an improvement in analog-digital converters, called "flash" analog-digital converters. This improvement consists in introducing a logic correction stage between the stage of the comparators and the encoder stage. This correction stage forces the output of an accidentally erroneous comparator to assume the same logic state, namely 0 or 1, as the outputs of the two neighboring comparators if these outputs are identical.

In other words, the correction circuit according to the invention sets the output of a comparator at 0, if this comparator output gives a logic 1 while the two comparators on either side of it both give a logic 0. Reciprocally, it sets the output of a comparator, giving a logic 0, at logic 1 if the two comparators on either side of it give a logic 1.

2. Description of the Prior Art

It is known that a flash-type analog-digital converter (other ADC structures exist) comprises, as very briefly recalled in FIG. 1, a first stage of parallel-mounted comparators $1,2 \ldots i, i+1, \ldots 2^n-2; 2^n-1$, if the ADC has to give a logic signal formed by n bits. The analog signal to be converted, at the input E, is applied in parallel to all the first inputs of the comparators. Reference voltages, in equal discrete values, are tapped at a voltage divider between $V_{min}$ and $V_{max}$, and are applied to the two inputs of the comparators.

The set forming the comparators and the voltage divider constitutes the comparator stage, referenced 3, which gives what is commonly called a "thermometer scale". This is to say that all the outputs of comparators for which the analog voltage is greater than the reference voltage give a logic 1 signal Reciprocally, all the outputs of the comparators for which the analog voltage is smaller than the reference voltage give a logic 0 signal.

The set of these $(2^n-1)$ logic values, namely a series of logic "ones" followed by a series of logic "zeros", or thermometer scale, is addressed to an encoding stage 4 that gives a binary number of "n" bits.

In fact, and above all in the field of microwaves with an analog frequency oscillating between 1 and 100 GHz, it can happen that the comparators do not work perfectly, and that one of them accidentally gives a logic 1 instead of a logic 0, or vice versa. Such accidents are due, for example, to a stray phenomenon during only one measurement (the comparators are all driven by a clock), or again because a comparator is isolated during calibration and is, therefore, temporarily incapable of working.

SUMMARY OF THE INVENTION

The invention therefore consists in the introduction, in an analog-digital converter, of a corrector stage between the comparator stage (input of the ADC) and the encoder stage (output of the ADC). This corrector stage forces the output of a comparator to assume the same logic value as that of the two comparators on either side of it, if and only if both of said logic values are identical but opposite to the accidentally erroneous value given by the comparator considered.

In more practical terms if, within a series of logic "ones", a comparator accidentally puts out a logic 0, the corrector circuit according to the invention corrects this accident and gives a logic 1. Similarly, if a logic 1 is in the midst of a series of logic "zeros", the corrector circuit corrects this accident and gives a logic 0.

The corrector circuit according to the invention is suited to the case of the two end comparators which have only one neighbor a least significant bit comparator 1 and a most significant bit comparator $2^n-1$.

More precisely, the invention concerns a parallel analog-digital converter, called a "flash" analog-digital converter, comprising a first stage formed by a plurality of parallel-mounted comparators (1 to $2^n-1$) which convert an analog value, applied to their common input, into a binary value formed by a sequence of logic "ones" and then of logic "zeros", called a thermometer scale, and also comprising a second encoder stage, which converts the values of the thermometer scale into a binary number, said converter further comprising, inserted between the first and second stages, a third stage which is a corrector stage, the function of which is to correct the accidentally erroneous output value B of a comparator, said value B presenting an anomaly in the thermometer scale, the corrector stage giving a corrected output value $B_{corr}$ that is homogeneous with the thermometer scale.

BRIEF DESCRIPTION OF THE DRAWINGS

The invention will be better understood from the following detailed description of an embodiment, made with reference to the appended figures, of which:

FIG. 1 is an electrical diagram, already described of a prior art analog-digital converter;

FIG. 2 is a block diagram of an ADC according to the invention;

FIG. 3 is an electrical diagram of an elementary correction cell according to the invention;

FIG. 4 is an electrical diagram of a central fragment of the correction stage, according to the invention;

FIG. 5 is an electrical diagram of the elementary correction cell, for the least significant bit end, according to the invention;

FIG. 6 is an electrical diagram of the elementary correction cell, for the most significant end bit, according to the invention;

FIG. 7 is a general diagram of the correction stage in an ADC according to the invention.

DESCRIPTION OF A PREFERRED EMBODIMENT

According to the foregoing, basically it is the position of the transition between the series of logic "ones" and the series of logic "zeros", in the thermometer scale of an ADC flash, that enables the encoder 4 to determine the binary conversion number.

If there is more than one transition, i.e. if there is at least one accidental transition such that:

$$\underset{\downarrow}{11 \ldots 101 \ldots 1100 \ldots 00}$$

$$\text{or} \quad \underset{\downarrow}{11 \ldots 1100 \ldots 010 \ldots 00}$$

the output of the comparator that gives an accidentally erroneous value must be corrected.

This is obtained through the invention, according to which an ADC shown in FIG. 2 is modified by adding on a corrector stage 5 between the comparator stage 3 and the encoder stage 4, which are quite standard stages. The comparator stage 3 gives a thermometer scale at 6. This thermometer scale is accidentally distorted by an error at an output that shall be called B. At 7, the corrector stage according to the invention gives a corrected thermometer stage, the corrected value B of which is correct.

The layout of a circuit such as this is simple. Just as the comparator stage 3 is formed by a plurality of parallel-mounted comparators 1 . . . ($2^n-1$), the corrector stage 5 is formed by a plurality of parallel-mounted circuits which shall hereinafter be called "cells" in order to simplify the description. To correct, if necessary, the output value of each comparator, the correction cell corresponding to this output compares it with the the output values of the two neighbouring comparators on either side of it, as shown in FIG. 3.

Let us consider an order i comparator, and let B be the Boolean value of its output. Let A and C be the Boolean values of the outputs of the two neighboring respectively order $i+1$ and $i-1$, comparators. The correction cell compares B with A and C, and must set B at logic 0 as soon as A=C=logic 0, or set B at logic 1 as soon as A=C=logic 1, but must preserve B in the other cases.

This criterion is met by the Boolean function $$B_{corr}=(A \text{ and } C) \text{ or } [B \text{ and } (A \text{ or } C)]$$

which is written $$B_{corr}=A.C+B.(A+C)$$

or $$B_{corr}=A.C+B.A+B.C$$

A.C represents the setting at 1 if and only if A=C=1. In effect, if A=C=1, A.C=1

B. (A+C) represents the setting at 0, if and only if A=C=0.
The following table results therefrom:

| A | C | A.C | B(A + C) | $B_{corr}$ |
|---|---|-----|----------|------------|
| 1 | 1 | 1 | ? | 1 |
| 0 | 0 | 0 | 0 | 0 |
| 0 | 1 | 0 | B | B |
| 1 | 0 | 0 | B | B |

The last two lines show that the correction circuit comes into play only if A=C=1 or if A=C=0. In the other cases, it does not correct B : $B_{corr}$=B.

This same Boolean function is satisfied by the truth table of $B_{corr}$:

| A | 0 | 1 | 0 | 1 | 0 | 1 | 0 | 1 |
|---|---|---|---|---|---|---|---|---|
| B | 0 | 0 | 1 | 1 | 0 | 0 | 1 | 1 |
| C | 0 | 0 | 0 | 0 | 1 | 1 | 1 | 1 |
| $B_{corr}$ | 0 | 0 | 0 | 1 | 0 | 1 | 1 | 1 |

The third column shows that there is setting at logic 0, and the sixth column shows that there is setting at logic 1.

Returning to FIG. 3, each cell of the corrector stage 5 comprises:
three parallel-mounted AND gates 8, 9 and 10,
one OR gate 11, in series with the three AND gates.

The output B of the comparator i is addressed to the first inputs (B) of the first and third AND gates 8 and 10.

The output A of the comparator $i+1$ is addressed to the second input (a) of the first AND gate 8 and the first input (A) of the second AND gate 9.

The output C of the comparator $i+1$ is addressed to the second input (C) of the third AND gate 10 and the second input (C) of the second AND gate 9.

Thus, the first AND gate 8 gives the Boolean function A.B (A and B) at output, the second gate 9 gives the function A.C (A and C) and the third gate 10 gives the function B C (B and C).

The outputs of the three AND gates 8, 9, 10 are addressed to the inputs of the OR gate 11, the output of which gives the value $B_{corr}$.

This circuit really verifies the Boolean function:

$$B_{corr}=(A.B) \text{ or } (A.C) \text{ or } (B.C)$$

Since there has to be one correction cell 8+9+10+11 for an order i comparator, the outputs A of the order $i+1$ comparator and C of the order $i-1$ comparator are addressed, at 12 and 13 respectively to two correction cells which give $A_{corr}$ and $C_{corr}$.

To the iterative scheme of the stage of comparators 3, there corresponds an iterative scheme of the corrector stage 5, one fragment of which is shown in FIG. 4. This figure highlights the fact that the corrector stage is formed by a sub-stage of AND gates in series with a sub-stage of OR gates.

It also shows that:
the order i comparator is associated with a cell 8+9+10+11,
the order $i+1$ comparator is associated with a cell 18+19+20+21,
the order $i-1$ comparator is associated with a cell 28+29+30+31.

It is noted that two AND gates 8 and 20 or 10 and 28 neighbor each other and both fulfil the same function, A.B or B.C respectively. The Boolean logic enables this scheme to be simplified but, in fact, this simplification leads to complexity of technological fabrication for the multiplexing of the output of an AND gate between the inputs of two OR gates, and this fact means that the simplification in question is not worthwhile.

The two end comparators in the thermometer scale represent a particular case since they have only one neighbor. The correction cells thereof are shown in FIGS. 5 and 6.

FIG. 5 corresponds to the most significant, order $2^n-1$ comparator, or the comparator of "the top" the thermometer scale. For this comparator, the operation is limited to prohibiting the logic 1 state, i.e. it is set at logic 0 once its order 2−2 neighbor gives a logic 0. In the first Boolean function written further above, it is:

$$]B \text{ and } (A \text{ or } C)]$$

that represents the setting at logic 0. Since A does not exist, it is enough to have an AND gate 14 that gives B.C.

For the least significant comparator, in FIG. 6, namely the comparator 1 on the thermometer scale, the operation is a similar one. The logic value 0 is prohibited, or its output is set at logic 1 once the order 2 comparator gives a logic 1. An AND gate 15 fulfils this function.

FIG. 7 shows the general electrical diagram of the corrective stage of a flash ADC, including its two furthest cells, which are limited to:

an OR gate 15 for the least significant converter 1;
an AND gate 14 for the most significant converter $2^n-1$.

This corrector state is applied to the fabrication of flash ADCs, especially those integrated on group III-V fast materials such as GaAs, but its diagram remains valid for slower flash ADCs, on silicon, in integrated circuit form or as discrete elements.

What is claimed is:

1. A parallel analog-digital converter, called a "flash" analog-digital converter, comprising a first stage formed by a plurality of parallel-mounted comparators which convert an analog value, applied to a common input of said comparators, into a binary value formed by a sequence of logic "ones" and then a logic "zeros", said sequence being called a thermometer scale, and also comprising a second stage which is an encoder stage which converts the values of the thermometer scale into a binary number, said converter further comprising, inserted between the first and second stages, a third stage which is a corrector stage, the function of which is to correct an accidentally erroneous output value B of a comparator, said value B presenting an anomaly in the thermometer scale, the corrector stage giving a corrected output value $B_{corr}$ that is homogeneous with the thermometer scale;

with A, B and C being output logic values, respectively, of three neighboring order i+1, order i and order i−1 comparators in the first stage, the third corrector stage forces the output B of the order i comparator to take the same corrected value $B_{corr}$ as the outputs A and C of the Two orders i+1 and i−1 comparators, if and only if these two output values A and C are equal, and opposite to the output value B of the order i comparator, verifying the Boolean function:

$B_{corr} = (A$ and $C)$ or $[B$ and $(A$ or $C)]$ or $B_{corr} = A.C + B.A. + B.C.$ 2. A parallel analog-digital converter, called a "flash" analog-digital converter, comprising a first stage formed by a plurality of parallel-mounted comparators which convert an analog value, applied to a common input of said comparators, into a binary value formed by a sequence of logic "ones" and logic "zeros", said sequence being called a thermometer scale, and also comprising a second stage which is an encoder stage which converts the values of the thermometer scale into a binary number, said converter further comprising, inserted between the first and second stages, a third stage which is a corrector stage, the function of which is to correct an accidentally erroneous output value B of a comparator, said value B presenting an anomaly in the thermometer scale, the corrector stage giving a corrected output value $B_{corr}$ that is homogeneous with the thermometer scale;

wherein the third corrector stage has a plurality of correction cells equal to the plurality of comparators of the first stage, the output B of each comparator being addressed to a correction cell which, if there is any anomaly in the thermometer cell, gives a corrected value $B_{corr}$;

wherein A, B and C are the output values, respectively, of three neighboring order i+1, order i and order i−1 comparators, wherein an order i comparator corresponds, in the third stage, to a correction cell formed by:

a sub-stage of three, parallel-mounted AND gates;
a sub-stage of one OR gate in series with the three AND gates that give the output value $B_{corr}$;
the output values A, B and C of the three comparators being addressed as follows: A and B to the first AND gate, A and C to the second AND gate, B and C to the third AND gate.

3. A parallel analog-digital converter, called a "flash" analog-digital converter, comprising a first stage formed by a plurality of parallel-mounted comparators which convert an analog value, applied to a common input of said comparators, into a binary value formed by a sequence of logic "ones" and logic "zeros", said sequence being called a thermometer scale, and also comprising a second stage which is an encoder stage, which converts the values of the thermometer scale into a binary number, said converter further comprising, inserted between the first and second stages, a third stage which is a corrector stage, the function of which is to correct an accidentally erroneous output value B of a comparator, said value B presenting an anomaly in the thermometer scale, the corrector stage giving a corrected output value $B_{corr}$ that is homogeneous with the thermometer scale;

wherein the third corrector stage has a plurality of correction cells equal to the plurality of comparators of the first stage, the output B of each comparator being addressed to a correction cell which, if there is any anomaly in the thermometer cell, gives a corrected value $B_{corr}$;

wherein, for the least significant comparator, the correction cell associated with said least significant comparator if formed by a single OR gate, which receives, at the input of said OR gate, the output value B and an output value A respectively, of said comparator, and of the very next more significant comparator, and gives an output value $B_{corr}$.

* * * * *